United States Patent [19]

Coppier et al.

[11] Patent Number: 5,049,893

[45] Date of Patent: Sep. 17, 1991

[54] MICROWAVE ENERGY DISTRIBUTOR CAPABLE OF RADIATING DIRECTLY

[75] Inventors: Hervé Coppier, Noyon; Jean-Louis Pourailly, Vincennes; Joseph Roger, Bures sur Yvette, all of France

[73] Assignee: Thomson-CSF, Puteaux, France

[21] Appl. No.: 546,371

[22] Filed: Jun. 29, 1990

[30] Foreign Application Priority Data

Jul. 7, 1989 [FR] France .............................. 89 09174

[51] Int. Cl.5 ........................ H01Q 13/00; H03H 5/00

[52] U.S. Cl. .................................... 343/772; 333/26; 343/786

[58] Field of Search ............... 343/772, 786, 782, 783, 343/780; 333/26

[56] References Cited

U.S. PATENT DOCUMENTS

| | | | |
|---|---|---|---|
| 2,703,841 | 3/1955 | Purcell | 343/772 |
| 3,002,189 | 9/1961 | Butler | 343/793 |
| 3,013,267 | 12/1961 | Rotman | 343/783 |
| 3,015,100 | 12/1961 | Rotman | 343/772 |
| 3,797,020 | 3/1974 | Roger et al. | 343/779 |
| 4,210,793 | 7/1980 | Fournet-Fayas | 343/772 |

FOREIGN PATENT DOCUMENTS

| | | | |
|---|---|---|---|
| 2027558 | 2/1980 | United Kingdom | 343/771 |

*Primary Examiner*—Michael C. Wimer
*Assistant Examiner*—Peter Toby Brown
*Attorney, Agent, or Firm*—Roland Plottel

[57] ABSTRACT

This distributor relates to radar antennas. It is used notably for making multiple-beam antennas. It is of the optical Blass matrix type. It has a horn-shaped guide with two energy leading-in central strips that radiate directly in space by means of excitation obstacles which are cylindrical studs arranged in pairs on the inner surfaces of the side walls to obtain the desired directivity. By means of this distributor, it is possible to simultaneously achieve sum and difference patterns or again different directions of aim.

7 Claims, 1 Drawing Sheet

MICROWAVE ENERGY DISTRIBUTOR CAPABLE OF RADIATING DIRECTLY

BACKGROUND OF THE INVENTION

1. Field of the Invention

The present invention concerns radar antennas for the transmission or reception of microwave energy and, notably, so-called multiple-beam antennas capable of emitting or receiving energy in space according to different radiation patterns.

Multiple-beam antennas such as this are used, for example, to simultaneously establish mutually orthogonal radiation patterns such as a pattern called a "sum pattern" having a very narrow main lobe in one direction of aim and a pattern called a "difference pattern" with a very substantially weakening in this direction of aim and with two narrow major lobes on either side of this direction 2. Description of the Prior Art One approach commonly used for making such antennas consists in providing for an array of radiating elements supplied by an energy distributor known as a Blass matrix. This distributor has several main energy leading-in lines and several secondary lines which intersect the former and lead to the array of radiating lines. Couplers are placed at each intersection so that a fraction of the incident energy on a main line is directed towards a secondary line in a well-determined direction, towards a radiating element placed at one end of this secondary line. The other end of this secondary line is provided with an absorbent load. Between two intersections of a secondary line with the different main lines, i.e. between the directional couplers corresponding to these intersections, phase shifters which may be line sections are inserted. The coupling coefficients of the different couplers and the phase-shifting values of the different constant or variable phase-shifters are computed so as to obtain the desired radiation patterns which differ according to whether the energy arrives by or is picked up by either of the main lines. Herein, we refer only to the operation of the antennas in transmission, but it is clear that they can work in reception too.

The Blass matrix is very frequently used, but it is costly and complicated to make, notably because of the directional couplers that have to be provided at each intersection.

A known way of overcoming this drawback is to eliminate the physical connection with the secondary lines. We then speak of an optical Blass matrix. In these optical Blass matrices, the secondary lines are replaced by direct radiation in space from the main lines which are the only ones remaining. This radiation caused by obstacles on the main lines is propagated directionally on only one side of the main lines with a degree of coupling and a phase shift that varies along each of the main lines, the variation curves of the coupling and of the phase-shifting being different for the different main lines so as to set up different radiation patterns, for example a sum pattern and a difference pattern at one and the same frequency or, again, two sum patterns corresponding to two different frequencies.

There is a known Blass matrix type microwave energy distributor comprising:

an elongated open guide provided with parallel side walls forming an elongated hollow structure open on one side essentially on its entire length, an absorbent load placed all along the guide between the side walls, at least two elongated, thin conductive strips placed between the load and the open side of the guide, parallel to the length of the guide, these strips being used as the main energy propagation lines and asymmetrical obstacles distributed in the cavity along the guide and formed by tongues cut out on the sides of the conductive strips and folded crosswise to these strips, said obstacles generating a radiation propagated towards the opening of the guide.

This known microwave energy distributor of the optical Blass type has the drawback of having radiating obstacles formed by thin tongues that have a low passband and cannot be used to form extensive couplings. This entails a penalty when making illuminations with a small number of sources. It also possesses the drawback of having obstacles that have to be manufactured with the main lines, making it necessary to have precise folds with respect to the perpendicular of the plane of these main lines.

SUMMARY OF THE INVENTION

The present invention is aimed at overcoming these drawbacks and at obtaining an optical Blass matrix type of distributor with radiating obstacles that have a wider passband of use and a more extensive dynamic range of coupling, and can be made by means of a more flexible manufacturing process.

An object of the invention is a microwave energy distributor of the optical Blass matrix type, with asymmetrical obstacles fixedly joined to the side walls of the guide. These asymmetrical obstacles may be either fixed to the side walls of the guide or form part of them. They are advantageously formed by pairs of metal studs that appear in relief on the inner flanks of the lateral walls of the guide facing the longitudinal edges of the conductive strips forming the main, lines.

BRIEF DESCRIPTION OF THE DRAWING

Other characteristics and advantages of the invention will emerge from the following description of an embodiment given as an example. This description is made with reference to the drawing, in which.

DESCRIPTION OF A PREFERRED EMBODIMENT

Figure 1:
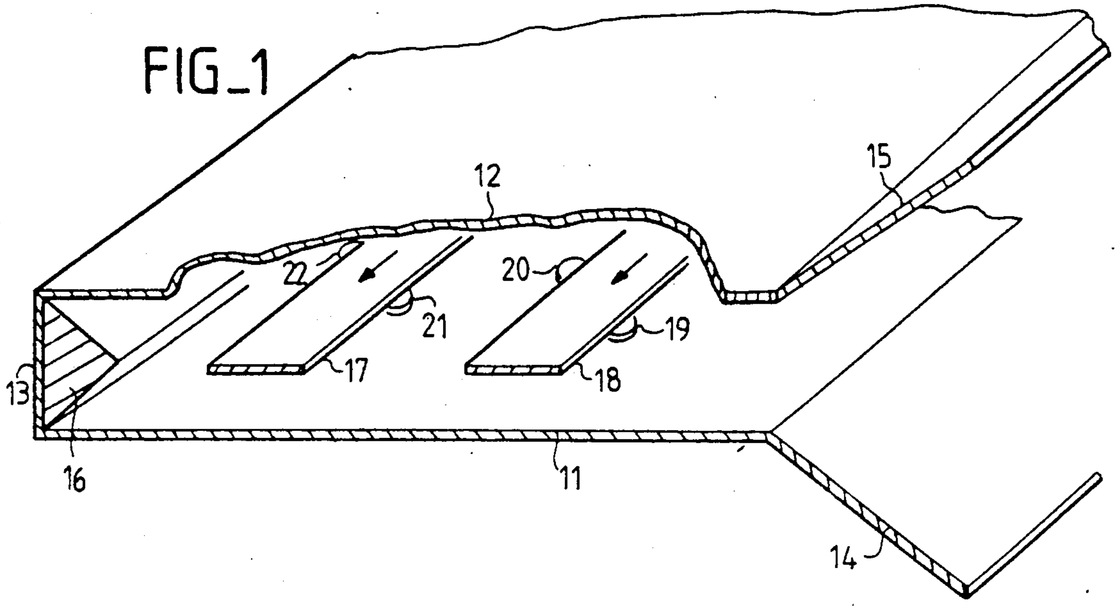
FIG. 1 is a sectional view in perspective of an energy distributor according to the invention.

The microwave energy distributor that shall be described is a distributor that radiates directly, through a guide structure with a a horn-shaped aperture, and comprises two main lines that make it possible to obtain two patterns, for example a sum pattern and a difference pattern. As shown in FIG. 1, it has the appearance of a hollow structure demarcating an elongated cavity open by one side along its entire length.

The hollow metal structure has two parallel side walls 11, 12 joined on one side by a back 13 and separated from the other by a radiating aperture shaped like a horn through a flaring out of the edges 14, 15 of the side walls 11, 12. These two side walls 11, 12 are also joined to the ends of the hollow structure by end walls (not shown).

A load 16, absorbing electromagnetic waves at working frequencies, is positioned inside the hollow structure, against the back 13.

Two conductive strips 17, 18 extend along the entire length of the hollow structure, in the median plane between the two parallel side walls 11, 12. They form the two main lines propagating electromagnetic energy in transverse antisymmetrical electromagnetic mode all along the distributor. They are connected at one end of the hollow structure to an energy source or energy receiver, for example through transitions with coaxial cables, and embedded in the other end of the hollow structure in absorbent loads designed to dissipate the energy residues. They are kept in position by spacers, not shown, which are made of a low loss dielectric material such as polyethylene tetrafluoride for example. Their thickness is far smaller than the distance between the side walls 11, 12 of the hollow structure. Their width is of the order of a quarter of the wavelength of the frequencies used. The spacing between the side walls 11, 12 of the hollow structure is preferably of a quarter of the working wavelength or even less.

Asymmetrical conductive obstacles formed by pairs of metal studs 19, 20, 21, 22 are placed inside the cavity on the side walls 11, 12 facing the conductive strips 17, 18. They excite a transverse electromagnetic propagation mode radiating towards the aperture and having a transverse electrical field directed in the propagation plane from one side wall towards the other side wall from a transverse antisymmetrical electromagnetic mode that gets propagated in the conductive strips 17, 18 in the direction indicated by the arrows.

The studs 19, 20, 21, 22 forming the obstacles are cylindrical and have a diameter of 10 mm for example, for use in C band. Their arrangement in pairs across the conductive strips 17, 18 allows for generating a propagation on only one side of each conductive strip 17, 18 towards the horn-shaped aperture of the hollow structure, somewhat in the manner of semi-transparent mirrors in optics. Their height with respect to the inner faces of the side walls 11, 12 determines the electromagnetic coupling between the energy transmitted on the conductive strips and the energy radiated towards the aperture.

Figure 2:
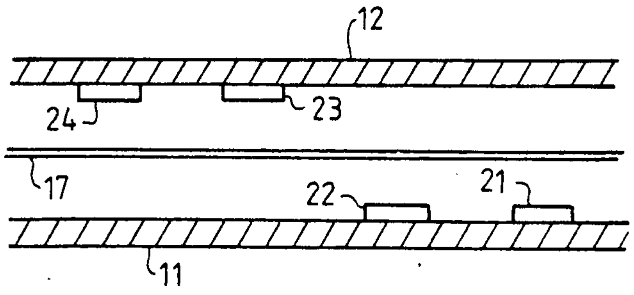
FIG. 2 is a partial longitudinal sectional view illustrating the relative positioning of the radiating obstacles with respect to a conductive strip and to the side walls of the energy distributor seen in FIG. 1
Figure 3:
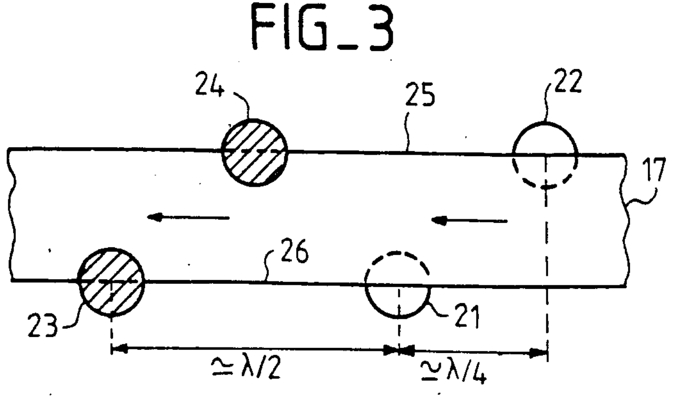
FIG. 3 is a top view in a partial section in the plane of the inner face of the upper side wall of the distributor seen in FIG. 1, illustrating the positioning of the obstacles facing a conductive strip.

These studs, the arrangements of which, with respect to the conductive strips 17, 18, are illustrated in FIGS. 2 and 3 are distributed in pairs along each conductive strip 17, 18 so as to obtain the desired directivity of radiation.

In a given pair, one of the studs 22, 24 is centered on a first longitudinal edge 25 of a conductive strip 17 while the other stud 21, 23 is centered on the second longitudinal edge 26 with a spacing in the lengthwise direction of the conductive strip close to a quarter of the working wave length $\lambda/4$.

Along a conductive strip 17, the pairs of studs 21, 22, 23, 24 are spaced out by a pitch close to half of the working wavelength $\lambda/2$ so as to have efficient sampling of the space, and are arranged alternately on either of the side walls 11, 12 so as to compensate for the $\pi$ phase shift resulting from the spacing pitch.

As shown in FIG. 3 the studs are distributed in pairs, 21 and 22, or 23 and 24, along each conductive strip. In a given pair the spacing between the studs, 21 and 22, is close to a quarter of the working wavelength. Along a strip, two pairs of studs, 21 and 22, 23 and 24, are spaced apart by half the working wavelength. The distance between stud 21 of the first pair, and stud 23 of the second consecutive pair, centered on the same longitudinal edge 26 of a conductive strip 17, is close to half of the working wavelength.

The metal studs 21, 22, 23, 24 may be made of copper like the conductive strips 17, 18 and mounted on the inner surface of the side walls in blind holes through a system of fixing by means of screws that enables their degree of penetration to be adjusted. They can also be milled in the mass of the metal side walls 11, 12.

The distributor that has just been described radiates energy directly from the aperture of its horn-shaped guide and behaves as an antenna. At its aperture, it could also have a lid fitted out with a row of sensors and outgoings of the guides or coaxial cables connected to radiating elements.

What is claimed is:

1. A microwave energy distributor comprising an elongated open guide provided with side walls parallel to each other and joined on one side by a back wall and separated to the other side by an aperture open essentially on its entire length;

an absorbent load extending along the guide in front of the back wall;

at least one elongated, thin conductive strip placed between the absorbent load and the open side of the guide in a median plane between the parallel side walls, said at least one conductive strip being electrically unconnected to said guide and serving as propagation lines for energy;

and asymmetrical obstacles distributed within the guide along the strip in pairs, each pair including two similar obstacles of which one obstacle is close to a first longitudinal edge of the strip and the other obstacle is close to the other longitudinal edge of the strip, said obstacles generating, from the incident energy on the strip, a radiation of a fraction of said energy that is propagated directionally towards the aperture of the guide, and wherein said asymmetrical obstacles are joined to the inner surface of the parallel side walls of the guide.

2. A distributor according to claim 1, wherein said asymmetrical obstacles form part of the side walls of the guide.

3. A distributor according to claim 1, wherein said asymmetrical obstacles are fixed to the side walls of the guide.

4. A distributor according to claim 1, wherein said asymmetrical obstacles are pairs of studs.

5. A distributor according to claim 4, wherein said studs are cylindrical.

6. A distributor according to claim 4 wherein two successive pairs of studs, arranged along a strip, are placed with one pair on one side wall of the guide and the other pair on the other side wall.

7. A distributor according to claim 1, comprising at least two conductive strips, and said asymmetrical obstacles being arranged along each of said conductive strips.

* * * * *